(12) United States Patent
Kuczynski et al.

(10) Patent No.: US 9,096,784 B2
(45) Date of Patent: Aug. 4, 2015

(54) METHOD AND SYSTEM FOR ALLIGNMENT OF GRAPHITE NANOFIBERS FOR ENHANCED THERMAL INTERFACE MATERIAL PERFORMANCE

(71) Applicants: Joseph Kuczynski, Rochester, MN (US); Arvind Kumar Sinha, Rochester, MN (US); Kevin Albert Splittstoesser, Stewartville, MN (US); Timothy Jerome Tofil, Rochester, MN (US)

(72) Inventors: Joseph Kuczynski, Rochester, MN (US); Arvind Kumar Sinha, Rochester, MN (US); Kevin Albert Splittstoesser, Stewartville, MN (US); Timothy Jerome Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/775,157

(22) Filed: Feb. 23, 2013

(65) Prior Publication Data
US 2014/0242349 A1   Aug. 28, 2014

Related U.S. Application Data

(62) Division of application No. 12/842,200, filed on Jul. 23, 2010.

(51) Int. Cl.
*B32B 9/00* (2006.01)
*C09K 5/00* (2006.01)
(Continued)

(52) U.S. Cl.
CPC ... *C09K 5/00* (2013.01); *B23B 5/12* (2013.01); *B32B 3/14* (2013.01); *B32B 5/02* (2013.01);
(Continued)

(58) Field of Classification Search
CPC .............. B32B 5/02; B32B 5/12; B32B 5/24; B32B 5/26; B32B 3/10; B32B 27/12; Y10S 428/903; Y10S 428/913; B82Y 30/00; C23C 16/26

USPC ............... 428/195.1, 408, 549, 688, 903, 913
See application file for complete search history.

(56) References Cited

U.S. PATENT DOCUMENTS

| 4,882,399 A | 11/1989 | Tesoro et al. |
| 5,506,753 A | 4/1996 | Bertin et al. |

(Continued)

FOREIGN PATENT DOCUMENTS

| JP | 2002273741 A | 9/2002 |
| JP | 2006193836 A | 7/2006 |

(Continued)

OTHER PUBLICATIONS

Tong et al. (Dense Vertically Aligned Multiwalled Carbon Nanotube Arrays as Thermal Interface Materials) Mar. 2007, vol. 30, No. 1.*

(Continued)

*Primary Examiner* — Betelhem Shewareged
(74) *Attorney, Agent, or Firm* — Stachler Intellectual Property LLC

(57) ABSTRACT

The exemplary embodiments of the present invention provide an apparatus and a thermal interface material with aligned graphite nanofibers in the thermal interface material to enhance the thermal interface material performance. The thermal interface material having a thickness between a first surface and a second surface opposite the first surface. The comprising thermal interface material includes a plurality of carbon nanofibers (CNFs), wherein a majority of the CNFs are oriented orthogonal to a plane of the first surface. The apparatus includes the thermal interface material, and a first object having a third surface; and a second object having a fourth surface; wherein the thermal interface material is sandwiched between the third surface and the fourth surface.

17 Claims, 5 Drawing Sheets

(51) Int. Cl.
| | |
|---|---|
| B32B 3/14 | (2006.01) |
| C09K 5/06 | (2006.01) |
| B32B 27/12 | (2006.01) |
| B82Y 30/00 | (2011.01) |
| B32B 5/24 | (2006.01) |
| B32B 5/02 | (2006.01) |
| C23C 16/26 | (2006.01) |
| B23B 5/12 | (2006.01) |

(52) U.S. Cl.
CPC . *B32B 5/24* (2013.01); *B32B 27/12* (2013.01); *B82Y 30/00* (2013.01); *C09K 5/06* (2013.01); *C23C 16/26* (2013.01); *Y10T 428/24802* (2015.01); *Y10T 428/30* (2015.01)

(56) References Cited

U.S. PATENT DOCUMENTS

| | | | |
|---|---|---|---|
| 5,912,282 | A | 6/1999 | Iyer et al. |
| 6,407,922 | B1 | 6/2002 | Eckblad et al. |
| 6,537,515 | B1 | 3/2003 | Baker et al. |
| 6,721,796 | B1 | 4/2004 | Wong |
| 6,730,731 | B2 | 5/2004 | Tobita et al. |
| 6,741,019 | B1 | 5/2004 | Filas et al. |
| 6,764,759 | B2 | 7/2004 | Duvall et al. |
| 6,790,425 | B1 | 9/2004 | Smalley et al. |
| 6,891,724 | B2 | 5/2005 | De Lorenzo et al. |
| 6,965,513 | B2 | 11/2005 | Montgomery et al. |
| 7,189,778 | B2 | 3/2007 | Tobita et al. |
| 7,238,415 | B2 | 7/2007 | Rodriguez et al. |
| 7,270,795 | B2 | 9/2007 | Kawakami et al. |
| 7,387,747 | B2 | 6/2008 | Taya et al. |
| 7,550,129 | B2 | 6/2009 | Baker et al. |
| 7,592,389 | B2 | 9/2009 | Baker et al. |
| 7,649,308 | B2 | 1/2010 | Lee et al. |
| 7,674,410 | B2 | 3/2010 | Huang et al. |
| 7,784,531 | B1 | 8/2010 | Li et al. |
| 7,803,262 | B2 | 9/2010 | Haik et al. |
| 7,847,394 | B2 | 12/2010 | Dubin et al. |
| 8,039,953 | B2 | 10/2011 | Dangelo |
| 8,048,794 | B2 | 11/2011 | Knickerbocker |
| 8,106,510 | B2 | 1/2012 | Altman et al. |
| 2002/0054849 | A1* | 5/2002 | Baker et al. ............. 423/447.2 |
| 2003/0117770 | A1* | 6/2003 | Montgomery et al. ....... 361/687 |
| 2004/0150100 | A1 | 8/2004 | Dubin et al. |
| 2005/0061496 | A1 | 3/2005 | Matabayas, Jr. |
| 2005/0239948 | A1 | 10/2005 | Haik et al. |
| 2005/0269726 | A1 | 12/2005 | Matabayas |
| 2006/0211327 | A1 | 9/2006 | Lee et al. |
| 2006/0286712 | A1 | 12/2006 | Brunschwiler et al. |
| 2008/0001283 | A1 | 1/2008 | Lee et al. |
| 2008/0042261 | A1 | 2/2008 | Wolter et al. |
| 2008/0080144 | A1 | 4/2008 | Machiroutu |
| 2009/0068387 | A1 | 3/2009 | Panzer et al. |
| 2009/0068461 | A1* | 3/2009 | Reneker et al. ............... 428/366 |
| 2009/0166021 | A1 | 7/2009 | Slaton et al. |
| 2009/0224422 | A1 | 9/2009 | Dubin |
| 2009/0236037 | A1 | 9/2009 | Fisher et al. |
| 2009/0247652 | A1 | 10/2009 | Silverman et al. |
| 2009/0269604 | A1 | 10/2009 | Wang et al. |
| 2009/0317660 | A1 | 12/2009 | Heintz et al. |
| 2010/0003530 | A1 | 1/2010 | Ganguli et al. |
| 2010/0224352 | A1 | 9/2010 | Stuckey et al. |
| 2011/0189500 | A1* | 8/2011 | Majumdar et al. ............ 428/623 |
| 2012/0292103 | A1 | 11/2012 | Dijon |

FOREIGN PATENT DOCUMENTS

| | | |
|---|---|---|
| JP | 2007012911 A | 1/2007 |
| JP | 2009084746 A | 4/2009 |
| JP | 2009246258 A | 10/2009 |
| JP | 2010034254 A1 | 2/2010 |
| JP | 2010050259 A2 | 3/2010 |
| KR | 1020050107094 A | 11/2005 |
| KR | 1020070023212 A | 2/2007 |
| KR | 1020110037055 A | 4/2011 |
| WO | 2004090944 A2 | 10/2004 |
| WO | 2005031864 A1 | 4/2005 |
| WO | 2006044938 | 4/2006 |
| WO | 2007089257 | 8/2007 |
| WO | WO 2008/112013 A1 * | 9/2008 ............... F28F 7/00 |
| WO | 2009075320 A1 | 6/2009 |

OTHER PUBLICATIONS

International Search Report and Written Opinion of the ISA dated Mar. 29, 2013—International Application No. PCT/US2012/065003.

Baker, R.T.K., "Synthesis, properties and applications of graphite nanofibers," Published: Jan. 1998; WTEC Hyper-Librarian, www.wtec.org/loyola/nano/us_r_n_d/09_03.htm. Downloaded May 4, 2011.

Fleischer et al., "Transient thermal management using phase change materials with embedded graphite nanofibers for systems with high power requirements," 11th Intersociety Conference on Thermal and Thermomechanical Phenomena in Electronic Systems, 2008. ITHERM 2008. May 28-31, 2008, pp. 561-566.

Ishioka et al., "Formation and Characteristics Vapor Grown Carbon Fibers Prepared in Linz-Donawitz Converter Gas," Carbon, vol. 30, No. 7, pp. 975-979. 1992.

Ishioka et al. "Formation of Vapor-Grown Carbon Fibers in CO—CO2—H2 Mixtures, I. Influence of Carrier Gas Composition," Carbon, vol. 30, No. 6, pp. 859-863, 1992.

Kopec et al., "Transient thermal performance of phase change materials with embedded graphite nanofibers," in "Thermes 2007: Thermal Challenges in Next Generation Systems," Garmella, S.V. and Fleischer, A.S., eds., Millpress, Rotterdam, The Netherlands, 2007, pp. 137-144.

Kuczynski et al. U.S. Appl. No. 12/842,200, filed Jul. 23, 2010.

Ruoff et al., "Mechanical and thermal properties of carbon nanotubes," Carbon, vol. 33, No. 7, pp. 925-930, 1995.

Tibbetts, Gary G., "Growing Carbon Fibers with a Linearly Increasing Temperature Sweep: Experiments and Modeling," Carbon, vol. 30, No. 3, pp. 399-406, 1992.

Weinstein et al., "The Experimental Exploration of Embedding Phase Change Materials with Graphite Nanofibers for the Thermal Management of Electronics," J. Heat Transfer, vol. 130, Issue 4. Apr. 2008. 8 pp.

Xie et al., "Dispersion and alignment of carbon nanotubes in polymer matrix: A review," Materials Science and Engineering: R: Reports, vol. 49, Issue 4, pp. 89-112, May 19, 2005.

Disclosed Anonymously, "Stretchable Thermal Interface Materials for Alignment of Graphitic Structures for Chipstack Cooling", IP.com Prior Art Database, IP.com No. IPCOM000213539D, Dec. 20, 2011.

N. M. Rodriguez, A review of catalytically grown carbon nanofibers, J. Mater. Res., vol. 8, No. 12, Dec. 1993, pp. 3233-3250.

Rodriguez, Nelly M. et al., "Catalytic Engineering of Carbon Nanostructures", American Chemical Society, Langmuir 1995, 11, pp. 3862 to 3866.

* cited by examiner

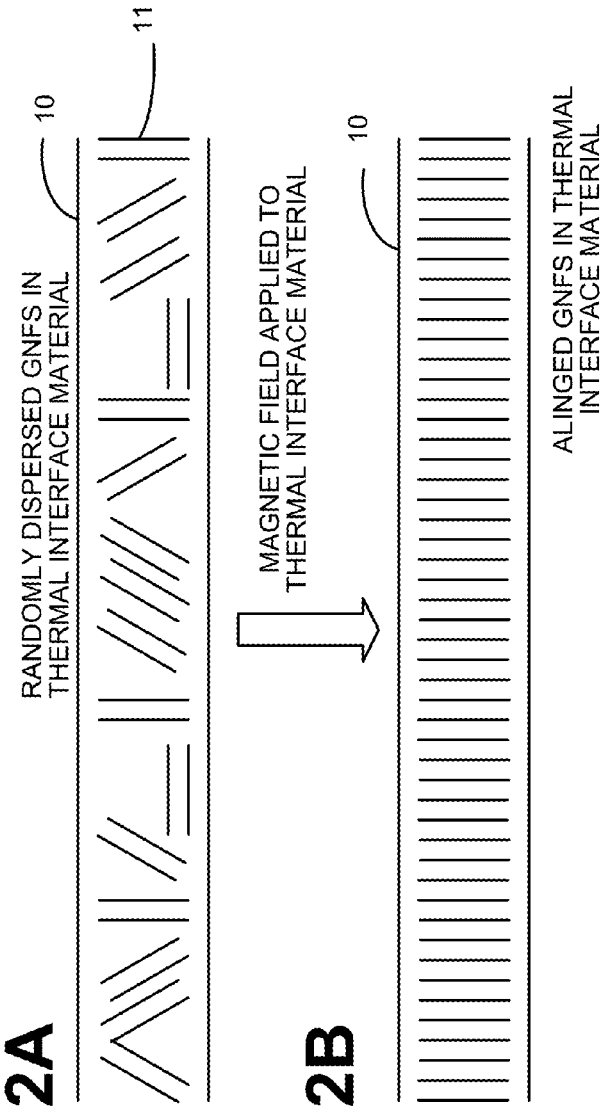
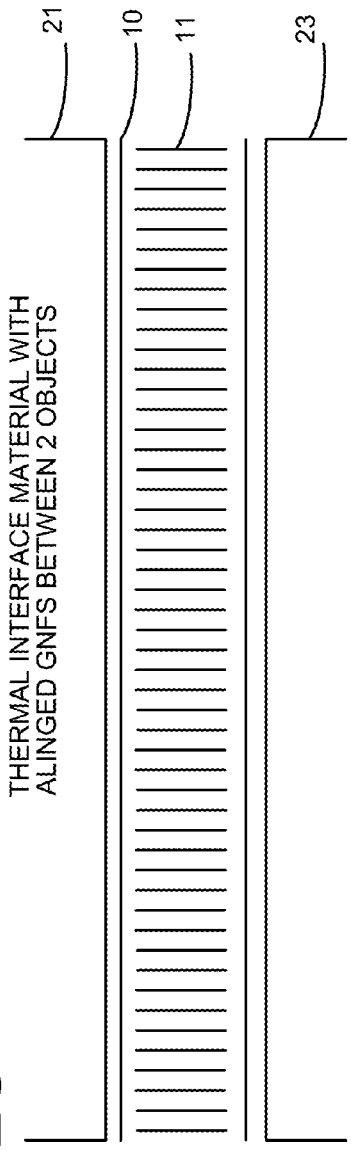

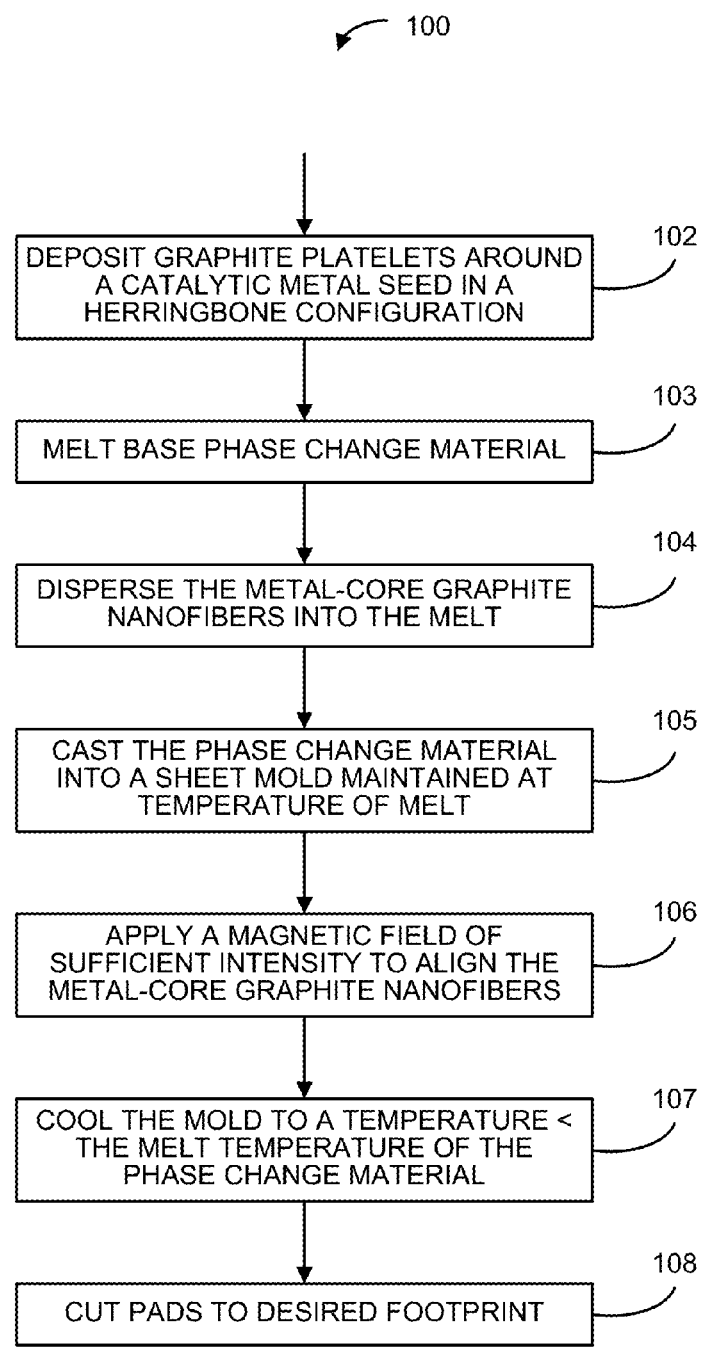

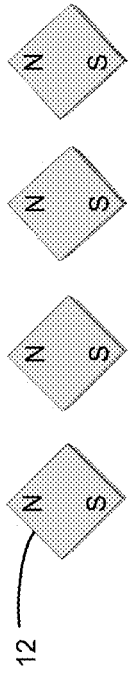
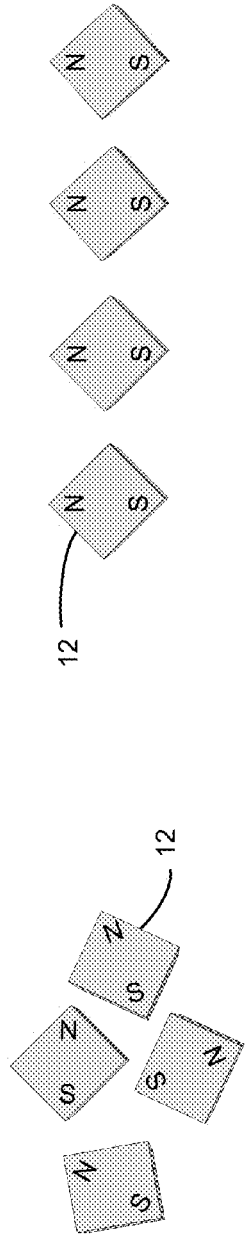
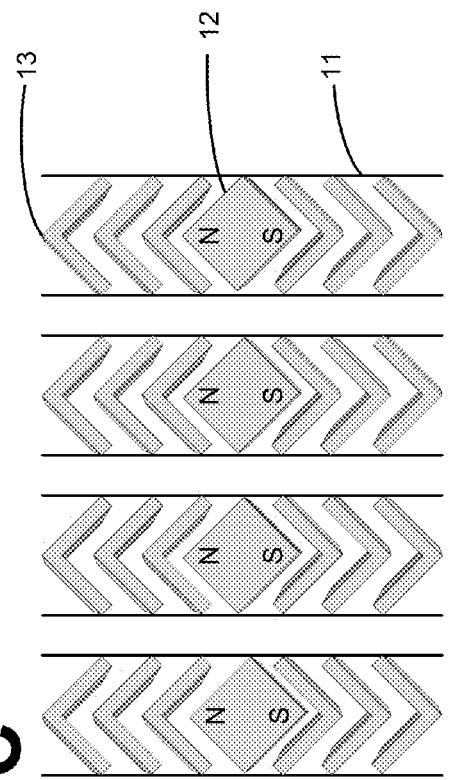

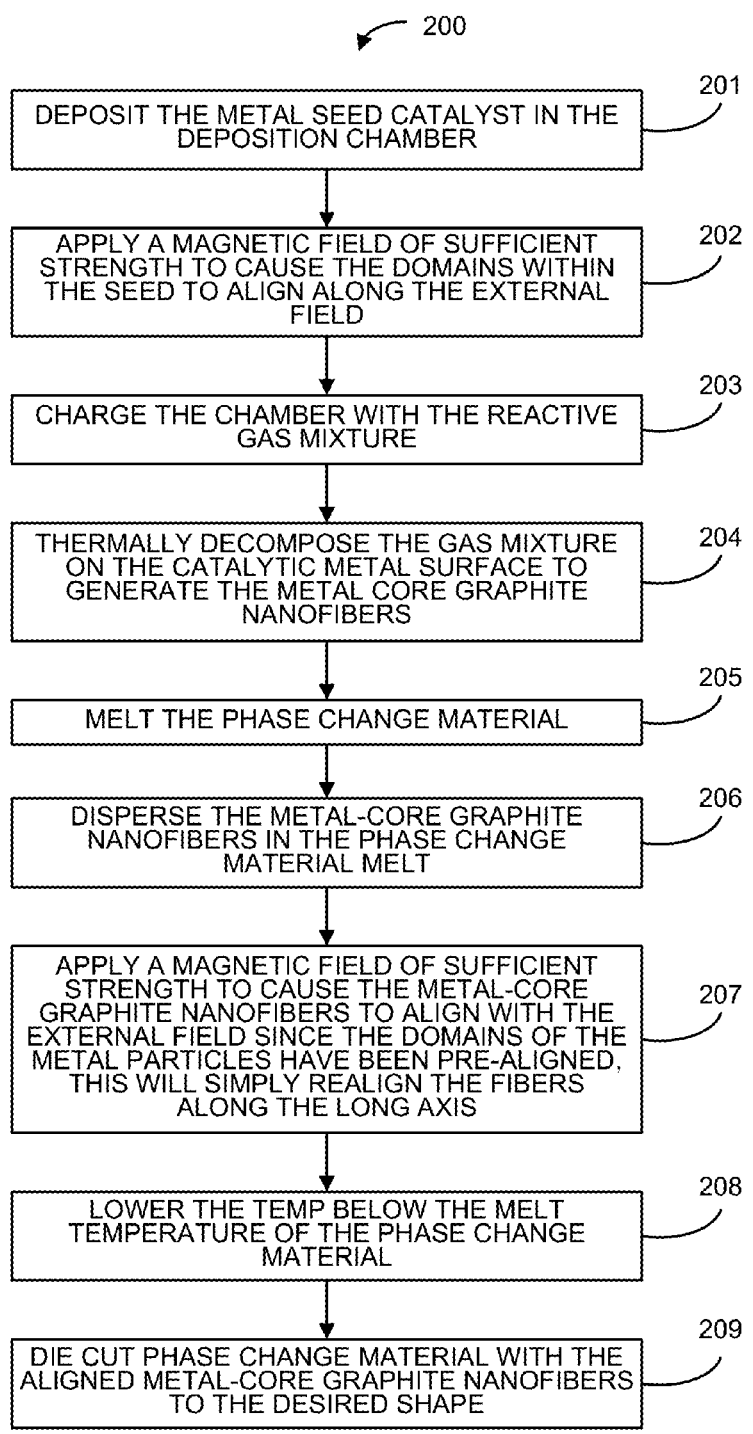

METHOD AND SYSTEM FOR ALLIGNMENT OF GRAPHITE NANOFIBERS FOR ENHANCED THERMAL INTERFACE MATERIAL PERFORMANCE

CROSS-REFERENCE TO RELATED APPLICATIONS

This application is a divisional of co-pending U.S. Utility patent application entitled, "A Method And System For Allignment Of Graphite Nanofibers For Enhanced Thermal Interface Material Performance" having Ser. No. 12/842,200, filed Jul. 23, 2010, by Kuczynski et al., which is entirely incorporated herein by reference.

FIELD OF THE INVENTION

The present invention generally relates to thermal interface materials, and more particularly, to a method and system for aligning graphite nanofibers to enhance thermal interface material performance.

BACKGROUND

Thermal interface materials are typically composed of an organic matrix highly loaded with a thermally conductive filler. Thermal conductivity is driven primarily by the nature of the filler, which is randomly and homogeneously distributed throughout the organic matrix. Commonly used fillers exhibit isotropic thermal conductivity and thermal interface materials utilizing these fillers must be highly loaded to achieve the desired thermal conductivity. Unfortunately, these loading levels degrade the properties of the base matrix material (such as flow, cohesion, interfacial adhesion, etc.).

Consequently, the thermal interface material formulator must balance matrix performance with thermal conductivity with the net result being a material with less than optimal thermal conductivity. It is desirable to formulate a thermal interface material with as high a thermal conductivity as possible without sacrificing other physical properties.

BRIEF SUMMARY

Embodiments of the present invention provide an apparatus and a thermal interface material with aligned graphite nanofibers in the thermal interface material to enhance the thermal interface material performance.

An exemplary embodiment includes a thermal interface material. The thermal interface material having a thickness between a first surface and a second surface opposite the first surface. The thermal interface material further includes a plurality of carbon nanofibers (CNFs), wherein a majority of the CNFs are oriented orthogonal to a plane of the first surface and wherein the CNFs comprise a magnetic catalytic seed.

Another exemplary embodiment includes an apparatus with enhanced thermal interface material performance. Briefly described in terms of architecture, one embodiment of the apparatus, among others, is implemented as follows. The apparatus includes a thermal interface material having a thickness between a first surface of the thermal interface material and a second surface of the thermal interface material, the thermal interface material further comprising a plurality of CNFs; wherein a majority of the CNFs are oriented orthogonal to a plane of the first surface, and a first object having a third surface; and a second object having a fourth surface; wherein the thermal interface material is sandwiched between the third surface and the fourth surface.

Another exemplary embodiment includes a thermal interface material. The thermal interface material having a thickness between a first surface and a second surface opposite the first surface. The thermal interface material further includes a plurality of carbon nanofibers (CNFs), wherein the CNFs comprise a magnetic catalytic seed, wherein a majority of the CNFs are oriented orthogonal to a plane of the first surface and second surface, and wherein the first surface is connected to a heat generating component and the second surface is connected to a heat dissipating structure.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawing and detailed description of the invention are exemplary and explanatory of preferred embodiments of the invention, and are not restrictive of the invention, as claimed.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 2A is a block diagram illustrating an example of the thermal interface material with graphite nanofibers randomly dispersed in the thermal interface material.

FIG. 2B is a block diagram illustrating an example of the thermal interface material with graphite nanofibers aligned by a magnetic field to orient the conductive axis in the desired direction in the thermal interface material.

FIG. 2C is a block diagram illustrating an example of the thermal interface material with graphite nanofibers aligned by a magnetic field between two objects.

FIG. 3 is a flow chart illustrating an example of the operation of the aligning system, of the present invention, that aligns metal-core graphite nanofibers dispersed in a thermal interface material.

FIG. 4A is a block diagram illustrating an example of the randomly dispersed metal seed particles.

FIG. 4B is a block diagram illustrating an example of the pre-aligned metal seed particles used to create the aligned metal-core graphite nanofibers.

FIG. 4C is a block diagram illustrating an example of graphite platelets deposited on the pre-aligned metal seed particles to create the metal-core graphite nanofibers FIG. 5 is a flow chart illustrating an example of the operation of the pre-aligning system of the present invention, that pre-aligns the magnetic poles of a metal seed that creates the metal-core graphite nanofibers dispersed in a thermal interface material.

The detailed description explains the preferred embodiments of the invention, together with advantages and features, by way of example with reference to the drawings.

DETAILED DESCRIPTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

One or more exemplary embodiments of the invention are described below in detail. The disclosed embodiments are intended to be illustrative only since numerous modifications and variations therein will be apparent to those of ordinary skill in the art.

It is well established that the incorporation of certain types of carbon nanofibers into thermal interface material can impart thermal conductivity to such materials. Carbon nanofibers can be dispersed in thermal interface material by various well-known techniques. These techniques include, but are not limited to, melting, kneading and dispersive mixers to form an admixture that can be subsequently shaped to form a thermally conductive article.

Nanofibers are defined as fibers with diameters on the order of 100 nanometers. They can be produced by interfacial polymerization and electrospinning. Carbon nanofibers are graphitized fibers produced by catalytic synthesis around a catalytic core. The catalytic core around which graphite platelets 13 are formed is, for exemplary purposes, called a metal seed or a catalytic metal seed 12, wherein the catalytic metal seed 12 is a material having magnetic properties such as iron, cobalt, or nickel. Other non-metal materials suitable for forming magnetically alignable graphite nanofibers are within the scope of the invention.

Figure 1B:
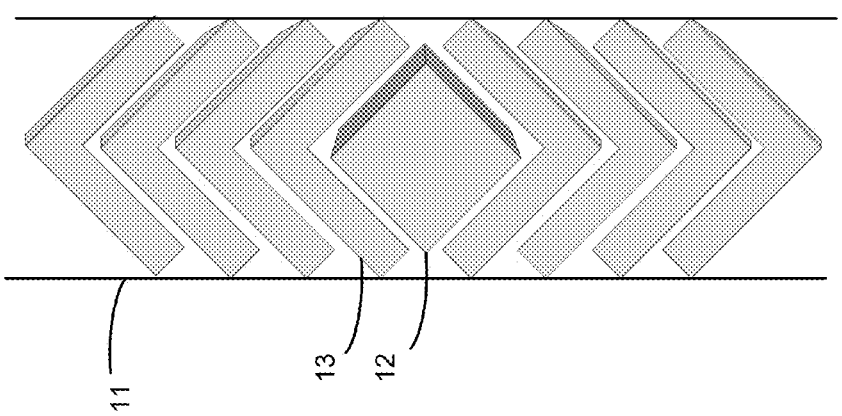
FIG. 1B is a block diagram illustrating an example of a metal-core herringbone graphite nanofiber utilized in thermal interface materials.
Figure 1A:
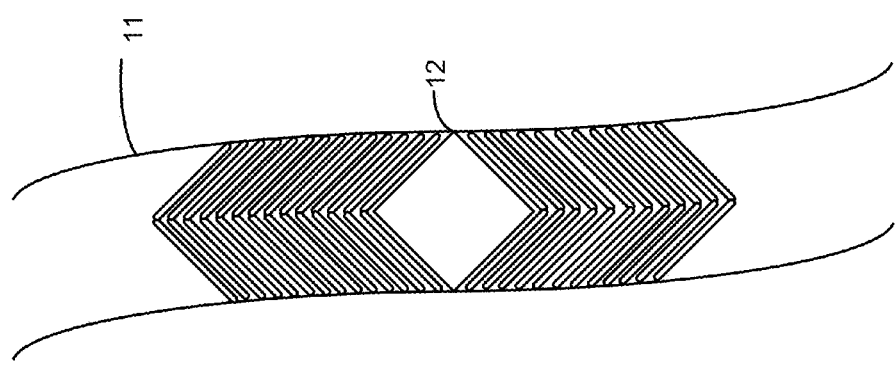
FIG. 1A is a block diagram illustrating an example of a metal-core graphite nanofiber utilized in thermal interface materials.

Metal-core graphite nanofibers 11 can be grown in numerous shapes around a catalytic metal seed 12. One example embodiment of metal-core graphite nanofiber 11 having a diamond shaped catalytic metal seed 12 is shown in FIGS. 1A, 1B and 4A-4C. From the physical point of view, metal-core graphite nanofibers vary from 5 to 100 microns in length and are between 5 to 100 nm in diameter. The metal-core graphite nanofibers 11 comprise of graphite platelets 13 arranged in various orientations with respect to the long axis of the fiber, giving rise to assorted conformations. In one embodiment, a magnetic field is applied to the metal catalyst prior to deposition of the graphite nanofibers on the metal-core. With the application of a magnetic field, the magnetic poles of the seed are aligned with the magnetic field and will subsequently carry the attached graphite nanofibers along with them as they rotate in the applied field following deposition.

With a diamond shaped catalytic metal seed 12, the majority of the graphite platelets 13 will align along the fiber axis as dictated by an external magnetic field, so that the catalytic metal seed 12 may have its poles aligned perpendicular to or parallel to the external magnetic field. The seed particles are not limited to elongated diamonds, so that the deposited metal-core graphite nanofiber 11 forms the chevrons. The graphite platelets 13 can assume any of a myriad of shapes. If the catalytic metal seeds 12 are rectangular plates, then the graphite platelets 13 are deposited as plates. If the catalytic metal seeds 12 are cylindrical, then the graphite platelets 13 are deposited as cylindrical plates. If the catalytic metal seeds 12 are little bars, then the graphite platelets 13 are deposited as rectangular solids along the long axis of the rectangular bar. The graphite platelets 13 assume the geometry of the catalytic metal seed 12 surface.

Graphite nanofibers have received considerable attention in the electronics field due to their remarkable thermal conductivity. Moreover, the thermal conductivity of graphite nanofibers is anisotropic. Anisotropy is the property of being directionally dependent, as opposed to isotropy, which implies homogeneity in all directions. Therefore, the present invention takes advantage of the anisotropic nature of the graphite nanofibers by effectively aligning them along the conductive axis, thereby generating a thermal interface material with exceptional thermal conductivity at comparatively low loading levels.

A thermal interface material is used to fill the gaps between thermal transfer surfaces, such as between microprocessors and heatsinks, in order to increase thermal transfer efficiency. These gaps are normally filled with air, which is a very poor conductor. A thermal interface material may take on many forms. The most common is the white-colored paste or thermal grease, typically silicone oil filled with aluminum oxide, zinc oxide, or boron nitride. Some brands of thermal interface materials use micronized or pulverized silver. Another type of thermal interface materials are the phase-change materials. The phase change materials are solid at room temperature, but liquefy and behave like grease at operating temperatures.

A phase change material is a substance with a high heat of fusion which, melting and solidifying at a certain temperature, is capable of storing and releasing large amounts of energy. Heat is absorbed or released when the material changes from solid to liquid and vice versa; thus, phase change materials are classified as latent heat storage units.

Phase change materials latent heat storage can be achieved through solid-solid, solid-liquid, solid-gas and liquid-gas phase change. However, the only phase change used for phase change materials is the solid-liquid change. Liquid-gas phase changes are not practical for use as thermal storage due to the large volumes or high pressures required to store the materials when in their gas phase. Liquid-gas transitions do have a higher heat of transformation than solid-liquid transitions. Solid-solid phase changes are typically very slow and have a rather low heat of transformation.

Initially, the solid-liquid phase change materials behave like sensible heat storage materials; their temperature rises as they absorb heat. Unlike conventional sensible heat storage, however, when phase change materials reach the temperature at which they change phase (i.e. melting temperature) they absorb large amounts of heat at an almost constant temperature. The phase change material continues to absorb heat without a significant rise in temperature until all the material is transformed to the liquid phase. When the ambient temperature around a liquid material falls, the phase change material solidifies, releasing its stored latent heat. A large number of phase change materials are available in any required temperature range from −5 up to 190° C. Within the human comfort range of 20° to 30° C., some phase change materials are very effective. They can store 5 to 14 times more heat per unit volume than conventional storage materials such as water, masonry, or rock.

When metal-core graphite nanofibers 11 are formulated into thermal interface materials 10 without further processing, the metal-core graphite nanofibers 11 are randomly distributed about the long axis of the thermal interface material as illustrated in FIG. 2A. The metal-core graphite nanofibers 11 lie at a multitude of orientations with respect to the mating surfaces. Consequently, the full benefit of the anisotropic nature of the thermal conductivity cannot be realized. If the catalytic metal seed 12 (FIGS. 1A and 1B) selected is magnetic (e.g., Ni or Co), the metal-core graphite nanofibers 11 can be dispersed into a suitable matrix and then aligned in a magnetic field to orient the conductive axis in the desired direction as illustrated in FIG. 2B. The alignment of the metal-core graphite nanofibers 11 on the conductive axis vastly improves the thermal conductivity of the thermal interface material 10.

For example, the thermal conductivity of a typical paraffinic phase change material can be increased 20× by incorporation of approximately 5 wt % randomly dispersed graphite nanofibers. The following operation of aligning graphite nanofibers results in axially aligned metal-core graphite nanofibers 11 in a phase change thermal interface material 10. The thermal conductivity of a typical paraffinic phase change material with graphite nanofibers can be increased by 300× through axially aligning the metal-core graphite nanofibers 11 using approximately 5 wt % graphite nanofibers.

FIG. 2C is a block diagram illustrating an example of the thermal interface material 10 with metal-core graphite nanofibers 11 aligned by a magnetic field between two objects (21 and 23) respectively. In one embodiment, object 21 is typically an integrated circuit and object 23 is a printed circuit board. However, in other alternative embodiments, the thermal interface material 10 may be disposed between a vapor chamber and a lidded die, a cold plate and an integrated circuit/lidded die, or a cold plate and a heat-generating electronic component (e.g., a variable transformer module). In still other alternative embodiments, the thermal interface material 10 may be disposed between any heat generating component and any heat dissipating structure.

FIG. 3 is a flow chart illustrating an example of the method of the aligning metal-core graphite nanofibers in the aligning graphite nanofibers system 100 of the present invention.

At step 102, the aligning graphite nanofibers system 100 prepares the metal-core graphite nanofibers 11 in a herringbone configuration as per known literature methods. At step 103, the base phase change material is melted. In one embodiment, the base phase change material is melted at a temperature 10-20 C above the phase change materials melting temperature. In one embodiment, the base phase change material is a paraffin based material. In other embodiments, the base phase change material can be, but is not limited to, Paraffins ($C_nH_{2n+2}$); Fatty acids ($CH_3(CH_2)_{2n}COOH$); Metal Salt hydrates ($M_nH_2O$); and Eutectics (which tend to be solutions of salts in water). In still another embodiment, the graphite nanofibers can be dispersed in silicone-based gels or pastes that are used as thermal interface materials that are eventually cured into pads. Therefore, the same method can be used to align the graphite nanofibers in the silicone resin then cure the silicone and cut the pads to the desired footprint.

At step 104, the metal-core graphite nanofibers 11 are disbursed into the melt using well-established methods. In one embodiment, a high-speed dispersive mixer can be utilized. The amount of metal-core graphite nanofibers 11 in the base phase change material of the present invention will typically be in the range of 4 to 10 weight percent based on the amount of base phase change material, preferably ~5 weight percent. The metal-core graphite nanofibers 11 typically are dispersed essentially homogeneously throughout the bulk of the base phase change material.

At step 105, the phase change material is cast into a sheet mold. The temperature of the phase change material and cast is maintained at approximately the melting temperature acquired at step 103. At step 106, a magnetic field of sufficient intensity is applied to the phase change material containing the metal-core graphite nanofibers 11, in order to align the metal-core graphite nanofibers. In one embodiment, the long axis of the metal-core graphite nanofibers 11 are aligned in an orientation perpendicular to the mating surfaces. In another embodiment, the metal-core graphite nanofibers 11 are aligned along conductive axis of the graphite fibers. In still another embodiment, the magnetic field is normally within the range of 500-100,000 Gauss or 0.05-10 Tesla.

At step 107, the mold is cooled to approximately room temperature. Once the mold with the aligned metal-core graphite nanofibers 11 in the phase change material has cooled to appropriately room temperature, the thermal interface material is removed from the mold. In one embodiment, the room temperature is normally within the range of 60 to 80° F., or 11.5 to 26.5° C. At step 108, pads are cut to the desired footprint. Pads of appropriately sized geometry (length X and width Y thickness) are cut from the slab of material using conventional techniques known to those skilled in the art at step 108. The geometry is dictated by the footprint of the integrated circuit to which the thermal interface material will be mated.

FIG. 4A is a block diagram illustrating an example of the randomly dispersed catalytic metal seeds 12. The catalytic metal seeds 12 are not limited to elongated diamonds, so that catalytic metal seeds 12 can assume any of a myriad of shapes including little bars. If the seed particles are rectangular plates, then the graphite platelets are deposit as plates, if the seed particles are cylindrical, then the graphite platelets deposit as cylindrical plates. The graphite platelets assume the geometry of the catalytic surface.

FIG. 4B is a block diagram illustrating an example of the pre-aligning catalytic metal seeds 12 used to create the aligned metal-core graphite nanofibers 11. Application of an external magnetic field can pre-align the magnetic poles of the catalytic metal seeds 12 by applying a magnetic field to the catalytic metal seeds 12 prior to deposition of the graphite platelets 13.

FIG. 4C is a block diagram illustrating an example of graphite platelets 13 deposited on the pre-aligned catalytic metal seeds 12 to create the aligned metal-core graphite nanofibers 11. In one embodiment, the catalytic metal seeds 12 are aligned by a magnetic field to orient the conductive axis in the desired direction. The magnetic poles of the catalytic metal seeds 12 are aligned by a magnetic field (not shown) to orient the conductive axis in the desired direction and will subsequently carry the attached catalytic metal seeds 12 along with them as the catalytic metal seeds 12 rotate in the applied magnetic field following deposition.

FIG. 5 is a flow chart illustrating an example of the operation of the pre-aligning system 200 of the present invention, that pre-aligns the magnetic poles of a catalytic metal seeds 12 that creates the metal-core graphite nanofibers 11 dispersed in a thermal interface material 10. This can be accomplished by applying a magnetic field to the catalytic metal seed 12 prior to deposition of the graphite platelets 13. In this fashion, the magnetic poles of the catalytic metal seeds 12 are aligned the desired way and will subsequently carry the attached metal-core graphite nanofibers 11 along with the catalytic metal seed 12 as they rotate in the applied field following deposition.

At step 201, the catalytic metal seeds 12 are deposited in the disposition chamber. In an alternative embodiment, the catalytic metal seeds 12 are illustrated as little bars. The seeds particles are not limited to any particular shape. The seed particles can assume any of a myriad of shapes and, they can be formed as little bars. If the seed particles are rectangular plates, then the graphite platelets 13 deposit as plates; if the seed particles are cylindrical, then the graphite platelets 13 deposit as cylindrical plates. The graphite platelets 13 assume the geometry of the surface of the catalytic metal seed 12.

Next at step 202, a magnetic field of sufficient strength to cause the domains within the catalytic metal seeds 12 to align along the external field is applied. Application of an external magnetic field pre-aligns the magnetic poles of the catalytic metal seed 12 by applying a magnetic field to the catalytic metal seed 12 prior to deposition of the graphite platelets 13 on the metal-core.

At step 203, the chamber is charged with the reactive gas mixture. By judicious choice of the catalytic metal seeds 12 catalyst, the ratio of the hydrocarbon/hydrogen reactant mixture, and reaction conditions, it is possible to tailor the morphological characteristics, the degree of crystallinity, and the orientation of the precipitated graphite crystallites with regard to the fiber axis. In one embodiment, the catalytic synthesis uses carbon-containing gases that include, but are not limited to, ethylene-hydrogen mixtures, methane-hydrogen mixtures, Co—Co2-H2 mixtures, CO, CH4, acetylene and benzene have been used as the carbon-containing gases. In another embodiment, a Linz-Donawitz converter gas (LDG), of which the composition is approximately 67% CO, 16% CO2, 11% N2, 1.2% H2, 0.2% 02, and 0.6% H2O can be utilized. Other gas combinations are known in the art can also be utilized.

At step 204, the gas mixture thermally decomposes onto the catalytic metal seed 12 to generate the metal-core graphite nanofibers 11. At step 205, the base phase change material is melted. In one embodiment, the base phase change material is melted at a temperature 10-20 C above the phase change materials melting temperature. In one embodiment, the base phase change material is a paraffin based material. In other embodiments, the base phase change material can be, but is not limited to, Paraffins ($C_nH_{2n+2}$); Fatty acids ($CH_3(CH_2)_{2n}$ COOH); Metal Salt hydrates ($M_nH_2O$); and Eutectics (which tend to be solutions of salts in water). In still another embodiment, the metal-core graphite nanofibers 11 can be dispersed in silicone-based gels or pastes that are used as thermal interface materials that are eventually cured into pads.

At step 206, the metal-core graphite nanofibers 11 are disbursed into the melt using well-established methods. In one embodiment, a high-speed dispersive mixer can be utilized. The amount of metal-core graphite nanofibers 11 in the base phase change material of the present invention will typically be in the range of 4 to 10 weight percent based on the amount of base phase change material, preferably ~5 weight percent. The metal-core graphite nanofibers 11 typically are dispersed essentially homogeneously throughout the bulk of the base phase change material.

At step 207, a magnetic field of sufficient intensity is applied to the phase change material containing the metal-core graphite nanofibers 11, in order to realign the metal-core graphite nanofibers 11 on their long axis. In one embodiment, the long axis of the metal-core graphite nanofibers 11 are aligned in an orientation perpendicular to the mating surfaces. In another embodiment, the metal-core graphite nanofibers 11 are aligned along the conductive axis of the graphite fibers. In still another embodiment, the magnetic field is normally within the range of 500-100,000 Gauss or 0.05-10 Tesla.

At step 208, the phase change material with the metal-core graphite nanofibers 11 is cooled to approximately room temperature. Once the phase change material with the metal-core graphite nanofibers 11 has cooled to appropriately room temperature, the phase change material is inundated with the metal-core graphite nanofibers 11 aligned in the preferred direction. In one embodiment, the room temperature is normally within the range of 60 to 80° F., or 11.5 to 26.5° C.

At step 209, the phase change material with the aligned metal-core graphite nanofibers 11 is cut to the desired footprint. Pads of appropriately sized geometry (length X and width Y thickness) are cut from the slab of material using conventional techniques known to those skilled in the art.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the functionality, and operation of possible implementations of systems and methods according to various embodiments of the present invention. In this regard, each block in the flowchart or block diagrams may represent a module, segment, or task to be performed, which comprises one or more executable steps for implementing the specified function(s). It should also be noted that, in some alternative implementations, the functions noted in the block may occur out of the order noted in the Figures. For example, two blocks shown in succession may in fact be performed substantially concurrently or the blocks may sometimes be executed in the reverse order, depending upon the functionality involved.

It should be emphasized that the above-described embodiments of the present invention, particularly any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A thermal interface material having a thickness between a first surface and a second surface opposite the first surface comprising; a plurality of carbon nanofibers (CNFs) and a base phase change material, wherein a majority of the CNFs are oriented orthogonal to a plane of the first surface by a magnetic field of sufficient intensity to align the CNFs in the thermal interface material, and wherein the CNFs comprise a magnetic catalytic seed.

2. The thermal interface material of claim 1, wherein the CNFs are in a herringbone configuration around the catalytic seed in the CNFs.

3. The thermal interface material of claim 2, wherein thermal interface material is cut into a desired footprint.

4. The thermal interface material of claim 1, wherein the CNFs in the base phase change material are in the range of 4 to 10 weight percent based on the amount of the base phase change material.

5. The thermal interface material of claim 1, wherein the CNFs in the base phase change material are approximately 5 weight percent.

6. The thermal interface material of claim 1, wherein the first surface is connect to a heat generating component and the second surface is connect to a heat dissipating structure.

7. An apparatus with enhanced thermal interface material performance comprising:
a thermal interface material having a thickness between a first surface of the thermal interface material and a second surface of the thermal interface material, the thermal interface material further comprising a plurality of carbon nanofibers (CNFs) wherein a majority of the CNFs are oriented orthogonal to a plane of the first surface; and a first object having a third surface; and a second object having a fourth surface; wherein the thermal interface material is cut into a desired footprint and sandwiched between the third surface and the fourth surface.

8. The apparatus of claim 7, wherein the majority of the CNFs are oriented orthogonal to the plane of the first surface by a magnetic field of sufficient intensity to align the CNFs in the thermal interface material.

9. The apparatus of claim 8, wherein the CNFs comprise a magnetic catalytic seed.

10. The apparatus of claim 8, wherein the thermal interface material includes a base phase change material.

11. The apparatus of claim 10, wherein the CNFs in the base phase change material are in the range of 4 to 10 weight percent based on the amount of base phase change material.

12. The apparatus of claim 10, wherein the CNFs in the base phase change material are approximately 5 weight percent.

13. The apparatus of claim 7, wherein the CNFs are aligned perpendicular to mating surfaces of the first object having the third surface; and the second object having the fourth surface.

14. The apparatus of claim 7, wherein the CNFs are in a herringbone configuration around the catalytic seed in the CNFs.

15. The apparatus of claim 7, wherein first object is a heat generating component and the second object surface is a heat dissipating structure.

16. A thermal interface material having a thickness between a first surface and a second surface opposite the first surface comprising; a plurality of carbon nanofibers (CNFs) and a base phase change material, wherein the CNFs in the base phase change material are in the range of 4 to 10 weight percent based on the amount of the base phase change material, wherein the CNFs comprise a magnetic catalytic seed, wherein a majority of the CNFs are oriented orthogonal to a plane of the first surface and second surface, and wherein the first surface is connected to a heat generating component and the second surface is connected to a heat dissipating structure.

17. The thermal interface material of claim 16, wherein the CNFs are in a herringbone configuration around the catalytic seed in the CNFs.

\* \* \* \* \*